United States Patent [19]
Jackson

[11] Patent Number: 5,442,353
[45] Date of Patent: Aug. 15, 1995

[54] BANDPASS SIGMA-DELTA ANALOG-TO-DIGITAL CONVERTER (ADC), METHOD THEREFOR, AND RECEIVER USING SAME

[75] Inventor: H. Spence Jackson, Austin, Tex.

[73] Assignee: Motorola, Inc., Schaumburg, Ill.

[21] Appl. No.: 140,948

[22] Filed: Oct. 25, 1993

[51] Int. Cl.$^6$ .............................................. H03M 3/02
[52] U.S. Cl. ...................................... 341/143; 375/244
[58] Field of Search ................ 341/143, 118, 120, 155; 364/724.1; 375/27–29, 33, 34

[56] References Cited

U.S. PATENT DOCUMENTS

| | | | |
|---|---|---|---|
| 5,027,120 | 6/1991 | Thurston | 341/143 |
| 5,084,702 | 1/1992 | Ribner | 341/143 |
| 5,103,229 | 4/1992 | Ribner | 341/143 |
| 5,124,705 | 6/1992 | Voorman | 341/143 |
| 5,153,593 | 10/1992 | Walden et al. | 341/143 |
| 5,181,032 | 1/1993 | Ribner | 341/143 |
| 5,198,817 | 3/1993 | Walden et al. | 341/143 |
| 5,283,578 | 2/1994 | Ribner et al. | 341/143 |
| 5,341,135 | 8/1994 | Pearce | 341/143 X |
| 5,345,406 | 9/1994 | Williams | 341/143 X |

FOREIGN PATENT DOCUMENTS

WO89/07368 8/1989 WIPO ............................ H03M 3/00

OTHER PUBLICATIONS

Schreier, et al.; "Bandpass Sigma-Delta Modulation;" Electronics Letters; vol. 25, No. 23, pp. 1560–1561, (1989).

Pearce, et al.; "The application of DSP techniques in HF Radio Receiver Design," Fourth Internat'l Conf., Publ. No. 284, pp. 205–209, (1988).

R. Schreier, et al.; "Multibit Bandpass Delta-Sigma Modulators Using N-Path Structures," IEEE 1992; pp. 593–596.

Gerhard Troster, et al.; "An Interpolative Bandpass Converter on a 1.2-$\mu$m BiCMOS Analog/Digital Array;" IEEE Journal of Solid–State Circuits, Vol. 28, No. 4, Apr. 1993; PP. 471–477.

Primary Examiner—Marc S. Hoff
Attorney, Agent, or Firm—Paul J. Polansky

[57] ABSTRACT

A bandpass sigma-delta analog-to-digital converter (ADC) (10) includes first (11) and second (12) bandpass sigma-delta modulators, and a digital filter (13) connected to digital outputs thereof. In the illustrated embodiment, the first bandpass sigma-delta modulator (11) is a second-order, single bit bandpass modulator, and the second bandpass sigma-delta modulator (12) is a first-order, multiple-bit modulator. Coefficients in feedback paths of the first (11) and second (12) modulators are derived from a transfer function of the digital filter. In one embodiment, a receiver (50) for a system such as frequency modulation (FM) radio converts an intermediate frequency (IF) analog signal to digital in-phase (I) and quaternary (Q) signals using the bandpass sigma-delta ADC (10).

28 Claims, 2 Drawing Sheets

BANDPASS SIGMA-DELTA ANALOG-TO-DIGITAL CONVERTER (ADC), METHOD THEREFOR, AND RECEIVER USING SAME

FIELD OF THE INVENTION

This invention relates generally to analog-to-digital converters (ADCs), and more particularly, to sigma-delta analog-to-digital converters.

BACKGROUND OF THE IVENTION

There are two basic techniques for implementing analog-to-digital converters (ADCs), the open-loop technique and the feedback technique. An open-loop converter generates a digital code directly upon application of an input voltage, and is generally asynchronous in operation. A feedback converter generates a sequence of digital codes from an input signal, reconverts these digital codes to an analog signal.

Sigma-delta ADCs use the feedback technique and have been known in the industry since the early 1960s. The sigma-delta technique is attractive because it achieves high resolution by precise timing instead of precisely matched on-chip components, such as resistors and capacitors used in open-loop converters. Thus, the sigma-delta technique is the technique of choice for many integrated circuit applications.

A basic sigma-delta ADC receives an analog input signal, and subtracts a feedback signal from the analog input signal to provide an error signal. The error signal is processed through a lowpass filter, and then quantized to form a digital output signal. A feedback digital-to-analog converter (DAC) provides the feedback signal after converting the digital output signal to analog form. Aside from the feedback DAC, the basic sigma-delta ADC may be implemented with conventional analog components such as operational amplifiers, comparators, and switched-capacitor filters. The basic sigma-delta ADC usually provides high resolution because integrated circuit clocking speeds allow the analog input signal to be highly oversampled. The basic sigma-delta ADC also has high signal-to-noise ratio (SNR) because the lowpass filter shapes quantization noise out-of-band, which can then be sufficiently attenuated by conventional filtering techniques.

While the basic sigma-delta ADC is easy to implement in conventional integrated circuit processes and generally has high performance, it still is not ideal for some applications. For example, a frequency modulation (FM) radio receiver receives a radio frequency (RF) signal, mixes the RF signal down to an intermediate frequency (IF), and mixes the IF signal to baseband to provide in-phase (I) and quadrature (Q) signals, and processes the I and Q baseband signals. A digital FM receiver may use the ADC to convert the IF analog signal to digital form for further digital signal processing.

However an FM receiver using the basic sigma-delta ADC has problems. The frequency band of the analog input signal may be relatively small (300 kilohertz (kHz) for entertainment FM radio) in relation to the IF center frequency (10.6875 megahertz (MHz), e.g.), which may in turn be relatively large compared to the sampling frequency. Thus the resulting oversampling ratio may well be insufficient to yield a digital signal with sufficient resolution. One technique to overcome these problems is to use two basic sigma-delta ADCs with inputs sampled out-of-phase. However, the ADCs in such a receiver create gain and phase errors and offsets due to component mismatch in the lowpass filter. Thus what is needed is an improved sigma-delta ADC for applications such as FM radio receivers and the like.

SUMMARY OF THE INVENTION

Accordingly, the present invention provides, in one form, a bandpass sigma-delta analog-to-digital converter (ADC) including first and second bandpass sigma-delta modulators and a digital filter. The first bandpass sigma-delta modulator converts a received analog signal into an intermediate analog signal and a first digital signal. The second bandpass sigma-delta modulator is operably coupled to the first bandpass sigma-delta modulator. The second bandpass sigma-delta modulator converts the intermediate analog signal into a second digital signal. The digital filter is operably coupled to the first bandpass sigma-delta modulator and the second bandpass sigma-delta modulator. The digital filter converts the first digital signal and the second digital signal into a digital output signal.

In another form, the present invention provides a receiver including a bandpass sigma-delta ADC, a digital quadrature mixer, a decimating digital filter, and a digital signal processor. The bandpass sigma-delta ADC includes first and second bandpass sigma-delta modulators and a digital filter. The first bandpass sigma-delta modulator converts a received analog signal into an intermediate analog signal and a first digital signal. The second bandpass sigma-delta modulator is operably coupled to the first bandpass sigma-delta modulator. The second bandpass sigma-delta modulator converts the intermediate analog signal into a second digital signal. The digital filter is operably coupled to the first bandpass sigma-delta modulator and the second bandpass sigma-delta modulator. The digital filter converts the first digital signal and the second digital signal into a digital output signal. The digital quadrature mixer mixes the digital output signal with a plurality of digital quadrature signals to produce a quadrature digital signal at baseband and an in-phase digital signal at baseband. The decimating digital filter decimates the quadrature digital signal and the in-phase digital signal to produce a decimated quadrature digital signal and a decimated in-phase digital signal. The digital signal processor processes the decimated quadrature digital signal and the decimated in-phase digital signal to produce a baseband analog signal.

In still another form, the present invention provides a method converting an analog signal to a digital signal. An analog input signal is received, and a first predetermined fraction of the analog input signal is summed with the first predetermined fraction of a first feedback signal to provide a first error signal. The first error signal is bandpass-filtered to provide a first intermediate analog signal. The first intermediate analog signal is quantized to provide a first digital signal. The first digital signal is digital-to-analog converted to provide the first feedback signal. A second predetermined fraction of the first intermediate analog signal is summed with the second predetermined fraction of a second feedback signal to provide a second error signal. The second error signal is bandpass-filtered to provide a second intermediate analog signal. The second intermediate analog signal is quantized to provide a second digital signal. The second digital signal is digital-to-analog converted to provide the second feedback signal. The first and second digital signals are filtered to provide first and second filtered signals, respectively. The first and second filtered signals are summed to provide a digital output signal.

These and other features and advantages will be more clearly understood from the following detailed description taken in conjunction with the accompanying drawings.

DETAILED DESCRIPTION OF A PREFERRED EMBODIMENT

Generally, the present invention relates to bandpass sigma-delta ($\Sigma\Delta$) analog-to-digital converters (ADCs), related methods, and receivers using such ADCs. An ADC according to the present invention has first and second sigma-delta modulators, each having at least one bandpass filter inside feedback loops thereof to effectively shape quantization noise to be relatively high outside the passband, and relatively low inside the passband. The second modulator takes its input from an analog output of the first modulator. A digital filter recombines digital outputs from the two modulators to form a final digital output signal. The digital filter cancels the quantization noise from the first modulator, which has a course, single-bit quantizer. The second modulator has a multi-bit quantizer, which generally causes nonlinearities in its output signal. However, the first modulator has a noise-shaping function which attenuates the non-linearities associated with the multi-bit quantizer in the second modulator. Such an ADC, which cascades two bandpass modulators, provides for higher-order noise shaping without the stability problems associated with single-loop structures. Also since the first modulator has a second-order noise shaping function, the second, multi-bit modulator does not require a high degree of linearity in a feedback digital-to-analog converter (DAC). In addition, the ADC allows selection of modulator coefficients such that the digital recombination filter is a simple function of shifts and adds, and thus is implemented with a minimum amount of circuitry.

Figure 1:
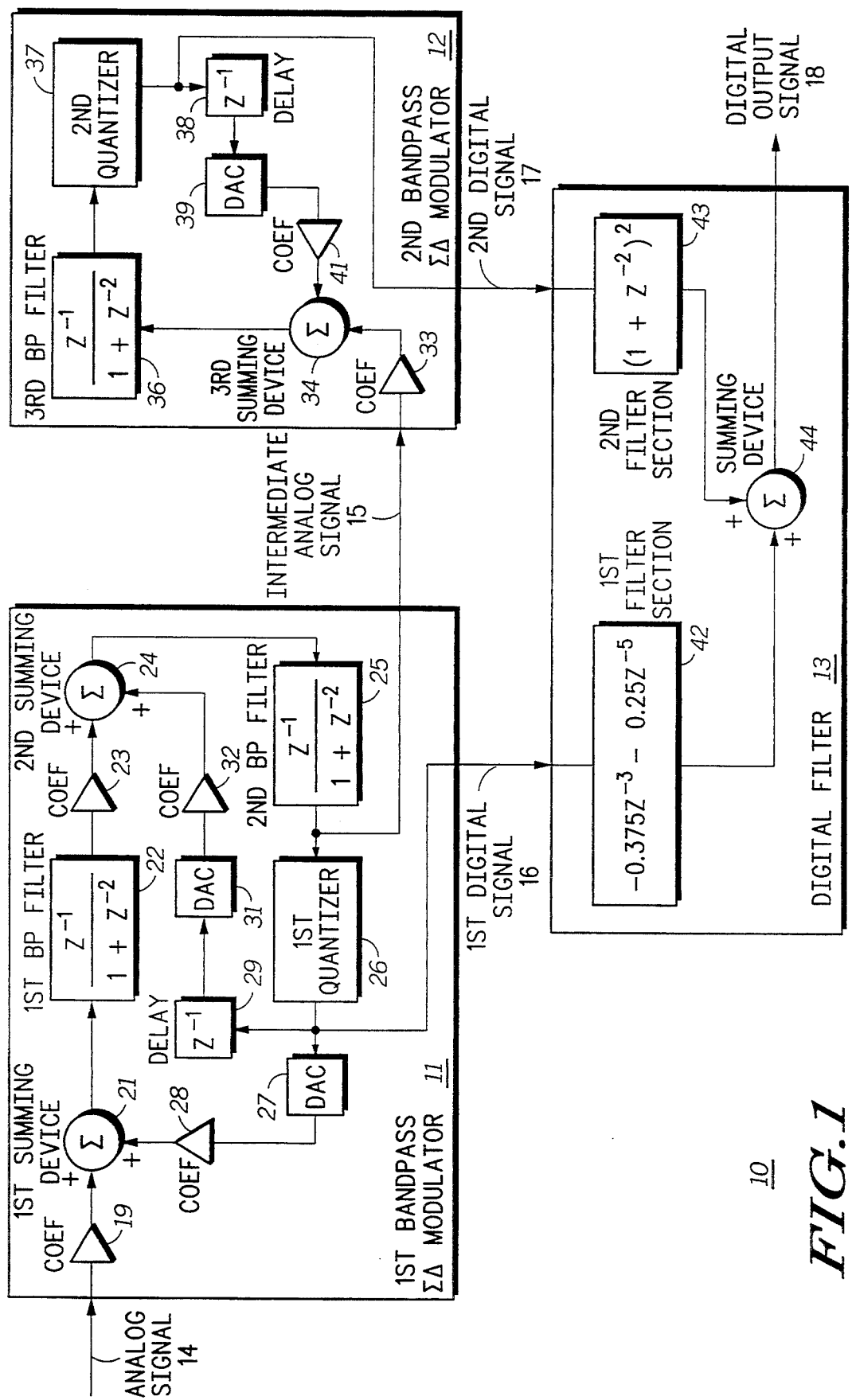
FIG. 1 illustrates in partial block diagram and partial logic diagram form a bandpass sigma-delta analog-to-digital converter (ADC) according to the present invention.
Figure 2:
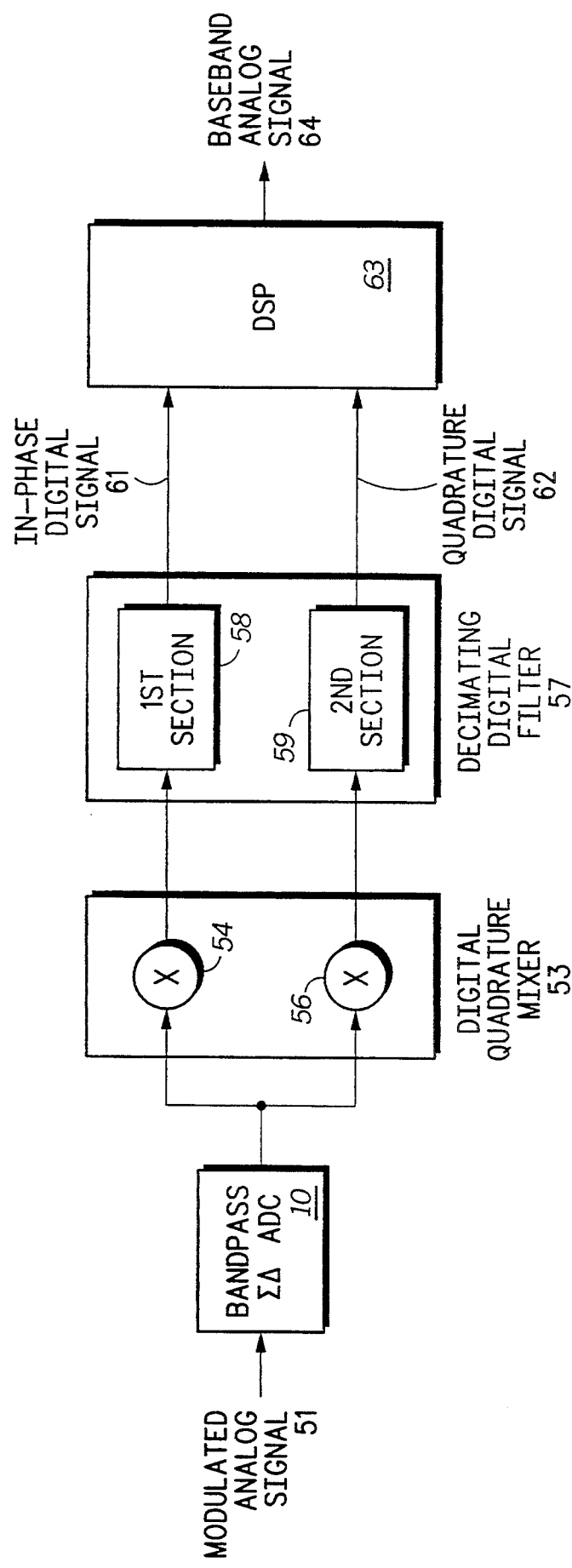
FIG. 2 illustrates in partial block diagram and partial logic diagram form a receiver using the bandpass sigma-delta ADC of FIG. 1 according to the present invention.

The present invention can be more fully understood with reference to FIGS. 1 and 2. FIG. 1 illustrates in partial block diagram and partial logic diagram form a bandpass sigma-delta analog-to-digital converter (ADC) 10 according to the present invention. ADC 10 includes generally a first bandpass sigma-delta modulator 11, a second bandpass sigma-delta modulator 12, and a digital filter 13. First bandpass sigma-delta modulator 11 receives an analog signal 14, and converts analog signal 14 to an intermediate analog signal 15 and a first digital signal 16. Second bandpass sigma-delta modulator 12 receives intermediate signal analog 15, and converts intermediate analog signal 15 into a second digital signal 17. Digital filter 13 converts first digital signal 16 and second digital signal 17 into a digital output signal 18.

First bandpass sigma-delta modulator 11 converts analog signal 14 into intermediate analog signal 15 and first digital signal 16 by receiving analog signal 14 in a coefficient buffer 19. A second coefficient buffer 28 receives an output of a digital-to-analog converter (DAC) 27 of modulator 11. A first summing device 21 combines an output of coefficient buffer 19 with an output of coefficient buffer 28. A first bandpass filter 22 receives an output of summing device 21. Bandpass filter 22 is ideally an infinite-quality (Q), second-order bandpass filter described by the transfer function $(z^{-1}/(1+z^{-2}))$ as illustrated in FIG. 1. Bandpass filter 22 has for a center frequency that is exactly one-fourth the sample frequency of modulator 11. A coefficient buffer 23 receives an output of bandpass filter 22 and provides an output to an input of a second summing device 24. A second input of summing device 24 receives an output from a coefficient buffer 32. A second bandpass filter 25, having the same transfer function as first bandpass filter 22, receives the output of second summing device 24, and has an output for providing intermediate analog signal 15. A first quantizer 26 has an input for receiving the output of second bandpass filter 25, and an output for providing first digital signal 16, which is the digital output of modulator 11. Quantizer 26 is a single-bit quantizer, with two levels of quantization. DAC 27 has an input for receiving the output of quantizer 26, and an output for providing an input to coefficient buffer 28. A first delay element 29 has an input for receiving the output of quantizer 26. A second DAC 31 has an input for receiving an output of delay element 29. Both DACs, 28 and 31, have the same resolution as quantizer 26, namely one bit. Coefficient buffer 32 has an input for receiving the output of DAC 31, and an output summed by second summing device 24.

Second bandpass sigma-delta modulator 12 converts intermediate analog signal 15 into second digital signal 17, and receives intermediate analog signal 15 at an input of a coefficient buffer 33. A third summing device 34 has inputs for receiving an output of coefficient buffer 33 and an output of a coefficient buffer 41, and an output for providing an input to a third bandpass filter 36. Bandpass filter 36 has the same transfer function as bandpass filters 22 and 25. A second quantizer 37 has an input for receiving an output of bandpass filter 36, which it converts into digital form and provides as digital signal 17 at an output thereof. A delay element 38 has an input for receiving the output of quantizer 37, and an output. A DAC 39 has an input for receiving the output of delay element 38, and an output. Coefficient buffer 41 has an input for receiving the output of DAC 39, and an output summed by summing device 34.

Digital filter 13 receives digital signal 16 from first sigma-delta modulator 11, and digital signal 17 from second sigma-delta modulator 12, and provides final digital output signal 18 as an overall analog-to-digital conversion output signal. A first digital filter section 42 receives first digital signal 16 and performs a filter function related to, but not equal to, the analog transfer function of first bandpass sigma-delta modulator 11. First digital filter section 42 has a transfer function $H_1(z)$ given by:

$$H_1(z) = -0.375z^{-3} - 0.25x^{-5} \qquad [1]$$

A second filter section 43 receives second digital signal 17 and performs a filter function related to, but not equal to, the analog transfer function of second bandpass sigma-delta modulator 12. Second filter section 43 has a transfer function $H_2(z)$ given by:

$$H_2(z) = (1 + z^{-2})^2 \qquad [2]$$

A summing device 44 has inputs for receiving outputs from first filter section 42 and second filter section 43, and an output for providing digital output signal 18, which represents the overall output of ADC 10 before decimation.

For converting signals of narrow bandwidth centered around a higher frequency, lowpass sigma-delta modulators (those with lowpass filters inside the feedback loop) are inefficient because they convert all signals up to the edge of the intended passband. The overall performance of the lowpass modulator is a function of the modulator's order, the number of bits in the quantizer, and the oversampling ratio (OSR). The OSR is the ratio of the modulator's sample rate to the bandwidth of the signal of interest. If the center frequency of the input signal is very high, while the bandwidth of interest is small, a lowpass modulator allows only a very low OSR, thus limiting overall performance.

In contrast, bandpass ADC 10 provides performance which is a function of the above-mentioned characteristics with the exception that the OSR is now the ratio of the modulator's sample rate to the bandwidth of interest, irrespective of the center frequency of the signal. For narrow-band signals, this characteristic allows for much higher OSRs and thus much higher resolution.

Bandpass ADC 10 converts analog input signal 14 to digital output signal 18 by cascading modulators 11 and 12, which allows for higher-order noise shaping without the instability problems associated with single-loop structures of order higher than two. The stability problem with single-loop structures, where the filter functions are all incorporated into one feedback loop, are wellknown and these structures become unstable with large amplitude input signals.

Bandpass ADC 10 also allows the use of multi-bit quantizers in the later sections of the converter. Quantizer 37 of modulator 12 is a four-bit quantizer, and DAC 39 is a four-bit DAC. Typically in nonlinear modulators having a single-loop structure, the nonlinearity inherent in the feedback DAC prevents the use of multi-bit architectures. However, in bandpass ADC 10, modulator 11 sufficiently attenuates any nonlinearity of feedback DAC 39 in modulator 12. In other embodiments, one or more additional modulators may be cascaded and these modulators also help attenuate the nonlinearity of multi-bit modulator 12.

By using modulators with bandpass filters having a center frequency equal to one-fourth the sample frequency of the modulator, bandpass ADC 10 provides a distinct advantage during subsequent signal processing, such as decimation and mixing. In order to mix digital output signal 18 down to baseband, a subsequent mixer (not illustrated in FIG. 1) may use a simple 0, 1, 0, and −1 pattern as a digital representation of a sine function. Thus, no multiplier is needed, and digital output signal 18 need only be zeroed, passed unmodified, or have its sign changed.

In the illustrated embodiment, summing devices 21, 24, and 34, coefficient buffers 19, 23, 28, 32, 33, and 41, bandpass filters 22, 25, and 36, quantizers 26 and 37, and DACs 27, 31, and 39 are all implemented with conventional analog circuitry. Delay elements 29 and 38, filter sections 42 and 43, and summing device 44 are each implemented with conventional digital circuitry. Coefficient buffers 19 and 28 each have a weighting of one-half, coefficient buffers 23 and 32 each have a weighting of one-fourth, and coefficient buffers 33 and 41 each have a weighting of one. Note that both input terminals of summing devices 21, 24, and 34 are positive because the second inputs thereof are made 180 degrees out-of-phase through other elements in the feedback loops.

FIG. 2 illustrates in partial block diagram and partial logic diagram form a receiver 50 using bandpass sigma-delta ADC 10 of FIG. 1 according to the present invention. Receiver 50 includes bandpass sigma-delta ADC 10 at its front-end to receive a modulated analog signal 51. Bandpass sigma-delta converter 10 converts modulated analog signal 51 into a digital output signal as discussed with above reference to FIG. 1. A digital quadrature mixer 53, which includes a first mixer 54 and a second mixer 56, receives the digital output signal from bandpass sigma-delta ADC 10. The two mixers, 54 and 56, respectively perform digital sine and cosine mixing at the same sample rate as bandpass sigma-delta modulator 10. Since the signal information is centered around one-fourth the sample rate of mixers 54 and 56, the mixing function need only be a sign change, a multiply by zero, or no change. Mixers 54 and 56 each shift the center frequency of the digital output signal to baseband (alternately designated "DC"), and create in-phase and quadrature versions, respectively, of the output of ADC 10. Since the information is now at baseband, the process of decimation, which decreases the word rate and increases the word length, becomes much easier. During the process of decimation, the in-phase and quadrature signals must be filtered to prevent aliased components from degrading the performance within the passband. Thus, receiver 50 includes a decimating digital filter 57, which is a lowpass filter, and is easier to implement and more efficient than a bandpass decimation filter. Decimating digital filter 57 has a first section 58 for receiving the output of mixer 54 and providing an in-phase digital signal 61 in response, and a second section 59 for receiving the output of mixer 56 and providing a quadrature signal digital signal 62 in response. A digital signal processor (DSP) 63 receives and demodulates in-phase digital signal 61 and quadrature digital signal 62 to provide a baseband analog signal 64 in response.

One known receiver which converts a narrow-band, bandpass signal centered around a relatively high frequency uses two lowpass converters clocked in quadrature. This receiver performs the mixing function at the sampling stage, and mixes the signal down to baseband before actually performing analog-to-digital conversion. The problems associated with this technique, however, are well-known. Since two converters are used, both with analog component variations, this receiver creates a gain mismatch between the two converters, which causes a degradation in the performance of the receiver. Since the ADC performs an analog mixing function, it creates a phase error (i.e. the two signals are not exactly in quadrature) which also causes degradation.

The most severe degradation, however, occurs because the analog circuitry introduces DC offset components into the signal during the analog-to-digital conversion process. Analog components introduce certain DC components which become part of the signal when the conversion is performed at baseband. In addition, some signals such as FM radio signals already contain DC components; these DC offsets corrupt the DC signal and may prevent their demodulation for small signal levels. Furthermore, since the minimum signal to be converted can be lower than −80 decibels (dB) relative to full scale, conventional offset cancellation techniques are not effective.

With a receiver using the bandpass approach like receiver 50, the input signal is analog-to-digital converted at a higher frequency, so that any DC offsets introduced by the analog circuits are not added to the signal of interest. Since these DC offsets are kept separate in frequency from the signal, when receiver 50 mixes them down to baseband, any DC offsets introduced before mixing are modulated up to the original center frequency of the signal and filtered out by filter 57. In addition, receiver 50 uses only one modulator to perform the analog-to-digital conversion, thus preventing gain mismatch. Both in-phase signal 61 and quadrature signal 62 have exactly the same amplitude since they are the same signal, with one being phase shifted by 90 degrees. Furthermore, receiver 50 has virtually no phase error since receiver 50 mixes the output of ADC 10 in the digital domain, in which digital quadrature mixer 53 provides virtually error-free digital mixing. Also, since digital quadrature mixer 53 performs digital mixing by either passing, multiplying by zero, or changing the sign of the input signal, receiver 50 introduces no error due to a limited resolution of the multiplier. Thus, receiver 50 has many advantages over known digital receivers, as well as purely analog receivers.

While the invention has been described in the context of a preferred embodiment, it will be apparent to those skilled in the art that the present invention may be modified in numerous ways and may assume many embodiments other than that specifically set out and described above. For example, ADC 10 may be used in other data conversion applications besides FM radio. Also, an ADC according to the present invention may cascade more than two bandpass modulators. Accordingly, it is intended by the appended claims to cover all modifications of the invention which fall within the true spirit and scope of the invention.

I claim:

1. A bandpass sigma-delta analog-to-digital converter (ADC) comprising:
   a first bandpass sigma-delta modulator that converts a received analog signal into an intermediate analog signal and a first digital signal;
   a second bandpass sigma-delta modulator operably coupled to said first bandpass sigma-delta modulator, wherein said second bandpass sigma-delta modulator converts said intermediate analog signal into a second digital signal; and
   a digital filter operably coupled to said first bandpass sigma-delta modulator and said second bandpass sigma-delta modulator, wherein said digital filter converts said first digital signal and said second digital signal into a digital output signal,
   said digital filter comprising:
   a first digital filter section having an input for receiving said first digital signal, and an output, said first digital filter section filtering said first digital signal according to a transfer function designated as $H_1(z)$ given substantially by $H_1(z) = -0.375z^{-3} - 0.25z^{-5}$;
   a second digital filter section having an input for receiving said first digital signal, and an output, said second digital filter section filtering said first digital signal according to a transfer function designated as $H_2(z)$ given substantially by $H_2(z) = (1+z^{-2})^2$; and
   a summing device having first and second inputs respectively coupled to outputs of said first and second digital filter sections, and an output terminal for providing said digital output signal.

2. The bandpass sigma-delta ADC of claim 1 wherein said first bandpass sigma-delta modulator is characterized as being a single-bit bandpass sigma-delta modulator and wherein said second bandpass sigma-delta modulator is characterized as being a multiple-bit sigma-delta modulator.

3. The bandpass sigma-delta ADC of claim 1 wherein said first bandpass sigma-delta modulator comprises a forward path having first and second bandpass filters and first and second coefficients.

4. The bandpass sigma-delta ADC of claim 1 wherein said second bandpass sigma-delta modulator includes a forward path having a bandpass filter and coefficients.

5. The bandpass sigma-delta ADC of claim 1 wherein said first bandpass sigma-delta modulator is characterized as being a second-order bandpass sigma-delta modulator, and wherein said second bandpass sigma-delta modulator is characterized as being a first-order bandpass sigma-delta modulator.

6. The bandpass sigma-delta ADC of claim 5 wherein said first bandpass sigma-delta modulator comprises:
   a first summing device having a first input terminal for receiving said received analog signal, a second input terminal for receiving a first feedback signal, and an output terminal;
   a first bandpass filter having an input terminal coupled to said output terminal of said first summing device, and an output terminal;
   a second summing device having a first input terminal coupled to said output terminal of said first bandpass filter, a second input terminal for receiving a second feedback signal, and an output terminal;
   a second bandpass filter having an input terminal coupled to said output terminal of said second summing device, and an output terminal;
   a first quantizer having an input terminal coupled to said output terminal of said second bandpass filter, and an output terminal; and
   a first digital-to-analog converter (DAC) having an input terminal coupled to said output terminal of said first quantizer, and an output terminal for providing said first and second feedback signals.

7. The bandpass sigma-delta ADC of claim 6 wherein said second bandpass sigma-delta modulator comprises:
   a third summing device having a first input terminal coupled to said output terminal of said second bandpass filter, a second input terminal for receiving a third feedback signal, and an output terminal;
   a third bandpass filter having an input terminal coupled to said output terminal of said third summing device, and an output terminal;
   a second quantizer having an input terminal coupled to said output terminal of said third bandpass filter, and an output terminal; and
   a second DAC having an input terminal coupled to said output terminal of said second quantizer, and an output terminal for providing said third feedback signal.

8. The bandpass sigma-delta ADC of claim 7 wherein said first summing device sums substantially 0.5 times signals at said first and second input terminals thereof, wherein said second summing device sums substantially 0.25 times signals at said first and second input terminals thereof, and wherein said third summing device sums substantially 1.0 times signals at said first and second input terminals thereof.

9. A receiver comprising:
a bandpass sigma-delta analog-to-digital converter (ADC) having:
  a first bandpass sigma-delta modulator that converts a received analog signal into an intermediate analog signal and a first digital signal;
  a second bandpass sigma-delta modulator operably coupled to said first bandpass sigma-delta modulator, wherein said second bandpass sigma-delta modulator converts said intermediate analog signal into a second digital signal; and
  a digital filter operably coupled to said first bandpass sigma-delta modulator and said second bandpass sigma-delta modulator, wherein said digital filter converts said first digital signal and said second digital signal into a digital output signal;
a digital quadrature mixer that mixes said digital output signal with a plurality of digital quadrature signals to produce a quadrature digital signal at baseband and an in-phase digital signal at baseband;
a decimating digital filter that decimates said quadrature digital signal and said in-phase digital signal to produce a decimated quadrature digital signal and a decimated in-phase digital signal; and
a digital signal processor that processes said decimated quadrature digital signal and said decimated in-phase digital signal to produce a baseband analog signal.

10. The receiver of claim 9 wherein said first bandpass sigma-delta modulator is characterized as being a single-bit bandpass sigma-delta modulator.

11. The receiver of claim 9 wherein said first bandpass sigma-delta modulator comprises a forward path having a first and second bandpass filters and first and second coefficients.

12. The receiver of claim 11 wherein said digital filter comprises first and second digital filter sections respectively having first and second transfer functions, wherein said first digital filter section filters said first digital signal and said second digital filter section filters said second digital signal, and wherein said first transfer function and said second transfer function are at least partially derived from said first and second coefficients.

13. The receiver of claim 9 wherein said second bandpass sigma-delta modulator is characterized as being a multiple-bit bandpass sigma-delta modulator.

14. The receiver of claim 9 wherein said second bandpass sigma-delta modulator includes a forward path having a bandpass filter and coefficients.

15. The receiver of claim 14 wherein said digital filter comprises first and second digital filter sections respectively having first and second transfer functions, wherein said first digital filter section filters said first digital signal and said second digital filter section filters the second digital signal, and wherein said first transfer function and said second transfer function are at least partially derived from said coefficients.

16. The receiver of claim 9 wherein said plurality of digital quadrature signals comprise 0, 1, and −1.

17. The receiver of claim 9, wherein said digital filter comprises:
  a first digital filter section having an input for receiving said first digital signal, and an output, said first digital filter section filtering said first digital signal according to a transfer function designated as $H_1(z)$ given substantially by $H_1(z) = -0.375z^{-3} - 0.25z^{-5}$;
  a second digital filter section having an input for receiving said first digital signal, and an output, said second digital filter section filtering said first digital signal according to a transfer function designated as $H_2(z)$ given substantially by $H_2(z) = (1+z^{-2})^2$; and
  a summing device having first and second inputs respectively coupled to outputs of said first and second digital filter sections, and an output terminal for providing said digital output signal.

18. A method for converting an analog signal to a digital signal comprising the steps of:
receiving an analog input signal;
summing one-half of said analog input signal with one-half of a first feedback signal to provide a first error signal;
bandpass filtering said first error signal to provide a first intermediate analog signal;
quantizing said first intermediate analog signal to provide a first digital signal;
digital-to-analog converting said first digital signal to provide said first feedback signal;
summing a first predetermined fraction of said first intermediate analog signal with said first predetermined fraction of a second feedback signal to provide a second error signal;
bandpass filtering said second error signal to provide a second intermediate analog signal;
quantizing said second intermediate analog signal to provide a second digital signal;
digital-to-analog converting said second digital signal to provide said second feedback signal;
filtering said first digital signal to provide a first filtered signal;
filtering said second digital signal to provide a second filtered signal; and
summing said first and second filtered signals to provide a digital output signal.

19. The method of claim 18 wherein said step of summing said first predetermined fraction of said first intermediate analog signal with said first predetermined fraction of said second feedback signal to provide said second error signal comprises the step of summing one times said first intermediate analog signal with one times said first feedback signal to provide said first error signal.

20. The method of claim 18 wherein said step of bandpass filtering said first error signal to provide said first intermediate analog signal comprises the steps of:
  bandpass filtering said first error signal in a first bandpass filter to provide a third intermediate analog signal;
  summing a second predetermined fraction of said third intermediate analog signal with said second predetermined fraction of said first feedback signal to provide a fourth intermediate analog signal;
  bandpass filtering said fourth intermediate analog signal to provide said first intermediate analog signal.

21. The method of claim 20 wherein said step of summing said second predetermined fraction of said third intermediate analog signal with said third predetermined fraction of said first feedback signal to provide said first intermediate analog signal comprises the step of summing one fourth of said third intermediate analog signal with one-fourth of said first feedback signal to provide said fourth intermediate analog signal.

22. The method of claim 18 wherein said step of quantizing said first intermediate analog signal to provide said first digital signal comprises the step of quantizing said first intermediate analog signal in a one-bit quantizer to provide said first digital signal.

23. The method of claim 18 wherein said step of quantizing said second intermediate analog signal to provide said second digital signal comprises the step of quantizing said second intermediate analog signal in a multiple-bit quantizer to provide said second digital signal.

24. The method of claim 18 wherein said step of filtering said first digital signal to provide said first filtered signal comprises the step of filtering said first digital signal according to a z-domain transfer function $H_1(z)$ given substantially by:

$$H_1(z) = -0.375z^{-3} - 0.25z^{-5}.$$

25. The method of claim 18 wherein said step of filtering said second digital signal to provide said second filtered signal comprises the step of filtering said second digital signal according to a z-domain transfer function $H_2(z)$ given substantially by:

$$H_2(z) = (1 + z^{-2})^2.$$

26. A method for converting an analog signal to a digital signal comprising the steps of:
   receiving an analog input signal;
   summing a first predetermined fraction of said analog input signal with said first predetermined fraction of a first feedback signal to provide a first error signal;
   bandpass filtering said first error signal to provide a first intermediate analog signal;
   quantizing said first intermediate analog signal to provide a first digital signal;
   digital-to-analog converting said first digital signal to provide said first feedback signal;
   summing a second predetermined fraction of said first intermediate analog signal with said second predetermined fraction of a second feedback signal to provide a second error signal;
   bandpass filtering said second error signal to provide a second intermediate analog signal;
   quantizing said second intermediate analog signal to provide a second digital signal;
   digital-to-analog converting said second digital signal to provide said second feedback signal;
   filtering said first digital signal according to a z-domain transfer function $H_1(z)$ given substantially by:

$$H_1(z) = -0.375z^{-3} - 0.25z^{-5}$$

to provide a first filtered signal;
   filtering said second digital signal to provide a second filtered signal; and
   summing said first and second filtered signals to provide a digital output signal.

27. The method of claim 26, wherein said step of filtering said second digital signal to provide said second filtered signal comprises the step of filtering said second digital signal according to a z-domain transfer function $H_2(z)$ given substantially by:

$$H_2(z) = (1 + z^{-2})^2$$

to provide said second filtered signal.

28. The method of claim 26, wherein said step of summing said first predetermined fraction of said analog input signal with said first predetermined fraction of said first feedback signal to provide said first error signal comprises the step of summing one-half of said analog input signal with one-half of said first feedback signal to provide said first error signal.

* * * * *